United States Patent
Torsi

(10) Patent No.: US 10,515,696 B2
(45) Date of Patent: *Dec. 24, 2019

(54) APPARATUSES AND METHODS FOR DETERMINING STABILITY OF A MEMORY CELL

(71) Applicant: Micron Technology, Inc., Boise, ID (US)

(72) Inventor: Alessandro Torsi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/337,989

(22) Filed: Jul. 22, 2014

(65) Prior Publication Data

US 2014/0334223 A1    Nov. 13, 2014

Related U.S. Application Data

(63) Continuation of application No. 13/276,053, filed on Oct. 18, 2011, now Pat. No. 8,787,065.

(51) Int. Cl.
  *G11C 13/00* (2006.01)
  *G11C 29/00* (2006.01)
(52) U.S. Cl.
  CPC ...... *G11C 13/0069* (2013.01); *G11C 13/0004* (2013.01); *G11C 13/0007* (2013.01); *G11C 13/0064* (2013.01); *G11C 29/00* (2013.01); *G11C 2013/0073* (2013.01); *G11C 2013/0076* (2013.01); *G11C 2013/0092* (2013.01)

(58) Field of Classification Search
  CPC ............ G11C 13/0004; G11C 13/0002; G11C 13/0033; G11C 13/0064; G11C 13/0069; G11C 2013/0064; G11C 2013/0069; G11C 2013/0047
  USPC ............................ 365/163, 201, 185.19, 148
  See application file for complete search history.

(56) References Cited

U.S. PATENT DOCUMENTS

| | | | |
|---|---|---|---|
| 7,499,317 B2 | 3/2009 | Ito |
| 7,639,522 B2 | 12/2009 | Cho et al. |
| 7,649,771 B2 | 1/2010 | Miu et al. |
| 7,778,066 B2 | 8/2010 | Horii et al. |
| 7,778,079 B2 | 8/2010 | Jeong et al. |
| 7,796,424 B2 | 9/2010 | Happ et al. |
| 7,800,935 B2 | 9/2010 | Maejima et al. |
| 7,826,248 B2 | 11/2010 | Xi et al. |

(Continued)

OTHER PUBLICATIONS

Specification and Figures from related U.S. Appl. No. 13/275,901 entitled Stablization of Resistive Memory.

(Continued)

*Primary Examiner* — Douglas King
(74) *Attorney, Agent, or Firm* — Dorsey & Whitney LLP

(57) ABSTRACT

Examples described include apparatuses and methods for determining stability of memory cells. Resistance variable memory cells may be used. Once a memory cell is placed in a low or high resistance state responsive to set or reset pulses, the stability of the state may be determined, such as by providing another pulse to the memory cell or otherwise stressing the cell. The another pulse may be of an opposite polarity to the set or reset pulses already applied. If the memory cell is no longer in the target state after providing the another pulse, additional set or reset pulses may be applied to achieve a stable state.

16 Claims, 5 Drawing Sheets

(56) References Cited

U.S. PATENT DOCUMENTS

| | | |
|---|---|---|
| 7,835,173 B2 | 11/2010 | Ma et al. |
| 7,885,121 B2 | 2/2011 | Takase |
| 8,787,065 B2 * | 7/2014 | Torsi .......................... 365/148 |
| 2002/0018365 A1 | 2/2002 | Yoshimura |
| 2005/0036368 A1 | 2/2005 | Yeh et al. |
| 2006/0050549 A1 * | 3/2006 | Adachi et al. ............... 365/148 |
| 2006/0220071 A1 * | 10/2006 | Kang et al. .................. 257/248 |
| 2006/0291308 A1 * | 12/2006 | Yusa ........................... 365/201 |
| 2009/0175071 A1 | 7/2009 | Lee et al. |
| 2010/0097849 A1 * | 4/2010 | Hwang ............... G11C 11/5678 365/163 |
| 2010/0237317 A1 | 9/2010 | Tsunoda |
| 2010/0284212 A1 | 11/2010 | Bedeschi et al. |
| 2011/0069539 A1 | 3/2011 | Eleftheriou et al. |
| 2011/0103128 A1 * | 5/2011 | Kanno ..................... G11C 7/02 365/148 |
| 2011/0128782 A1 * | 6/2011 | Goda ................. G11C 16/0483 365/185.02 |
| 2012/0170359 A1 | 7/2012 | Wu et al. |
| 2013/0094276 A1 | 4/2013 | Torsi |

OTHER PUBLICATIONS

Waser, Rainer et al., "Redox-Based Resistive Switching Memories—Nanoionic Mechanisms, Prospects,and Challenges", Advanced Materials, Issue No. 21, 2009, pp. 2632-2663.

Zhang, Wangyuan et al., "Helmet: A Resistance Drift Resilient Architecture for Multi-level Cell Phase Change Memory System", IEEE/IFIP 41st International Conference on Dependable Systems & Networks, Jun. 27, 2011, pp. 197-208.

* cited by examiner

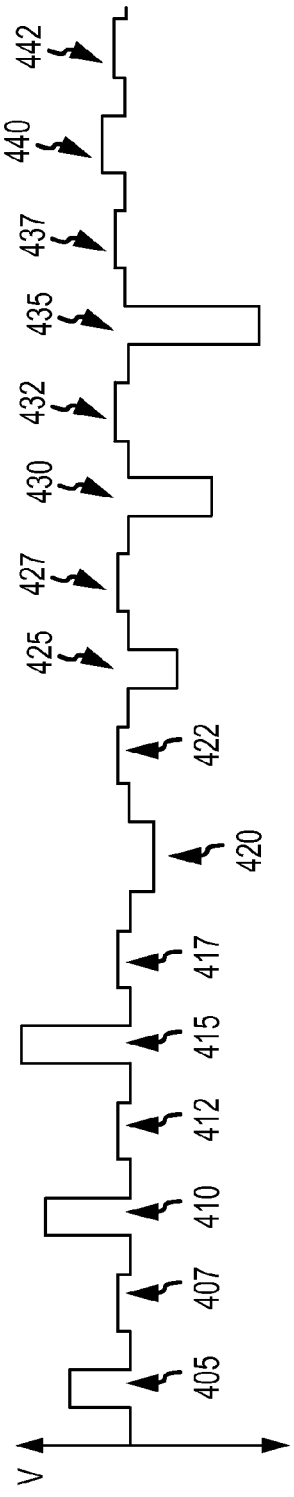
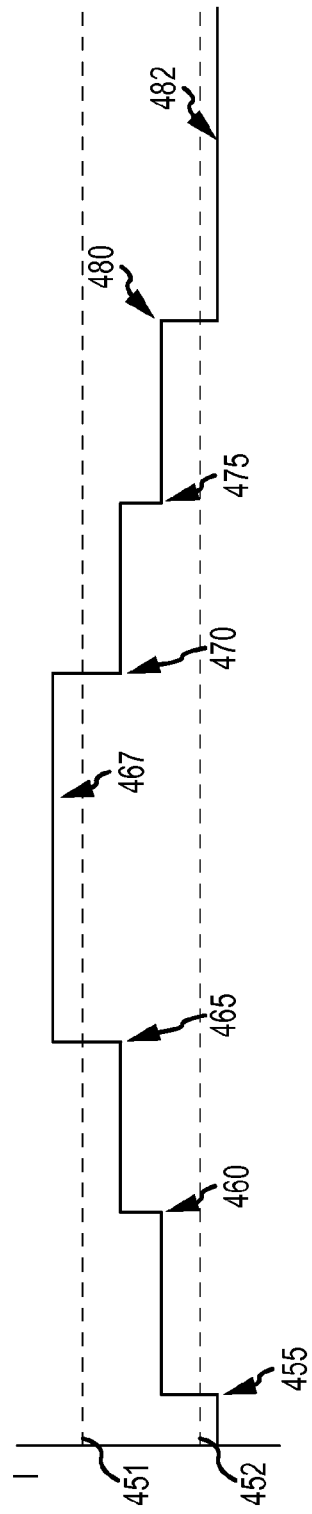

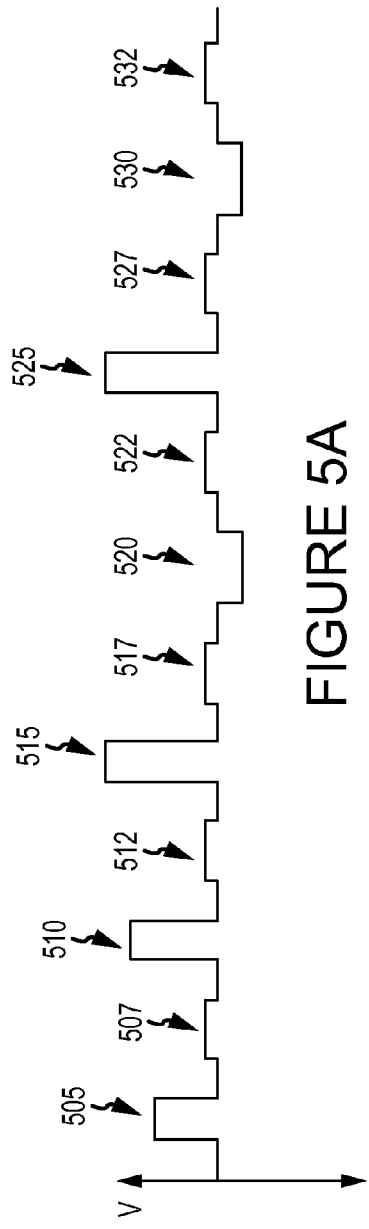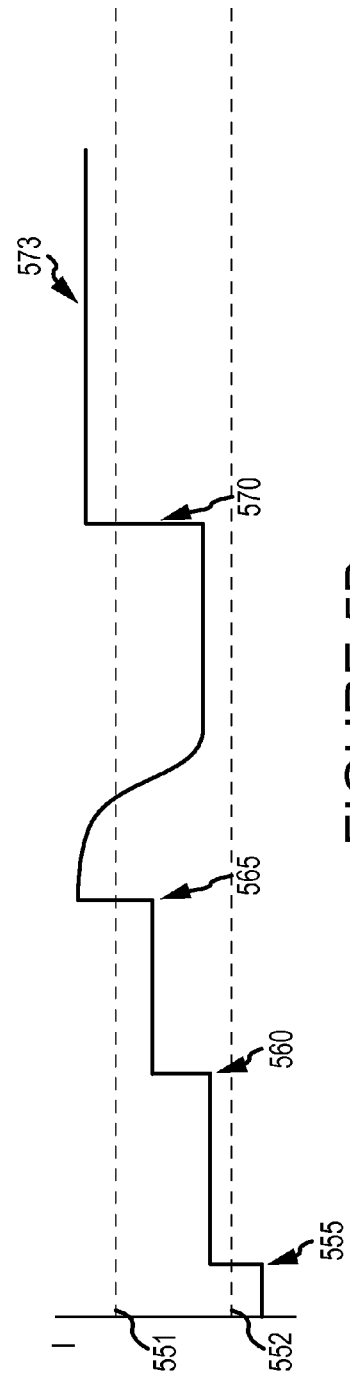
FIGURE 5A
FIGURE 5B

APPARATUSES AND METHODS FOR DETERMINING STABILITY OF A MEMORY CELL

CROSS-REFERENCE TO RELATED APPLICATION(S)

This application is a continuation of U.S. patent application Ser. No. 13/276,053, filed Oct. 18, 2011. This application is incorporated herein by reference, in its entirety, for any purpose.

TECHNICAL FIELD

Embodiments of the invention relate generally to memory devices, and examples of set and reset techniques are described which may be used in resistance variable random access memory devices.

BACKGROUND

Memory devices may be provided in apparatuses such as computers or other electronic devices, including but not limited to portable memory devices, solid state drives, personal digital assistants, music players, cameras, phones, wireless devices, displays, chip sets, set top boxes, gaming systems, vehicles, and appliances. There are many different types of memory including random-access memory (RAM), read only memory (ROM), dynamic random access memory (DRAM), synchronous dynamic random access memory (SDRAM), flash memory, and resistance variable memory, among others.

Apparatuses, such as resistance variable memory devices, may be used as non-volatile memory for a wide range of electronic devices. Resistance variable memory devices may include, for example, phase change random access memory (PCRAM) or resistive random access memory (RRAM), among others. A physical layout of a PCRAM device may resemble that of a DRAM device where the capacitor of the DRAM cell is replaced by a phase change material, e.g., Germanium-Antimony-Telluride (GST) or other chalcogenide materials. That is, an access device such as a diode or metal oxide semiconductor field effect transistor (MOSFET) can be connected in series with the phase change material. Chalcogenide materials can include compounds of sulfides, selenides, or tellurides, among others. GST has been used in rewriteable optical discs, e.g., rewritable compact discs (CD-RW) and rewritable digital versatile discs (DVD-RW).

A physical layout of an RRAM device may include memory cells including a dielectric exhibiting sufficient switching properties. The thin film can be connected to an access device such as a diode, a field effect transistor (FET), or a bipolar junction transistor (BJT). Generally, an RRAM device may include resistance variable memory elements that may include any dielectric material exhibiting sufficient switching properties. Example dielectrics include perovskites, transition metal oxides, chalcogenides, and silicon dioxide.

Memory cells, including resistance variable memory cells, can be programmed to one of a plurality of resistance states. The resistance of a PCRAM memory cell can be altered by applying energy pulses to the phase change material, e.g., GST. For example, material properties of the GST may be altered by heating it with a programming current. Generally, a higher resistance state may be associated with a more amorphous state of the phase change material, and a lower resistance state may be associated with a more crystalline state of the phase change material.

The resistance of an RRAM memory cell can be increased and/or decreased by applying positive and/or negative electrical pulses across the film. Generally, a voltage pulse of a sufficiently high magnitude provided (e.g. applied) to a resistance variable memory element may cause a conduction path, e.g. one or more filaments, to form through an otherwise dielectric, e.g. insulating, material. Once formed the filament may be reset (e.g. broken, yielding a high resistance) or again set (e.g. reformed, yielding a low resistance). High resistance and low resistance states, as used herein, refer to states of a memory cell having a detectable difference in resistance.

To sense data stored on a resistance variable memory cell, the resistance of the memory cell may be sensed. In a binary system, a low resistance may correspond to a first data value, e.g., 0, and a high resistance may correspond to a second value, e.g., 1. In some binary systems, a low resistance may correspond to a data value of 1 while a high resistance corresponds to a data value of 0. During a sensing operation, a sensed voltage and/or current corresponding to a resistance of a selected memory cell may be compared to a reference voltage and/or current to determine the content of stored data. That is, the resistance of the selected memory cell may be sensed indirectly. For example, a transient response of a sensing circuit that is connected to the selected memory cell may be sensed, e.g., in response to a change in voltage or current.

A single level cell (SLC) can be programmed to one of two resistance states, each corresponding to one of the binary digits 1 or 0. Memory cells can also store more than one digit of data, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can be programmed to one of more than two resistance states, e.g., each corresponding to more than one bit of data. Some non-volatile memories, such as flash, may achieve MLC functionality by storing one of a range of charges on a floating gate memory cell. Resistance variable memories may achieve MLC functionality by programming a memory cell to one of multiple detectable resistance states.

BRIEF DESCRIPTION OF THE DRAWINGS

FIGS. 4A and 4B are schematic illustrations of applied voltages and measured currents of a memory cell in accordance with an embodiment of the present invention.

FIGS. 5A and 5B are schematic illustrations of applied voltages and measured currents of a memory cell in accordance with an embodiment of the present invention.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, memory components, control signals, timing protocols, and software operations have not been shown in detail in order to avoid unnecessarily obscuring the described embodiments of the invention.

Figure 1:
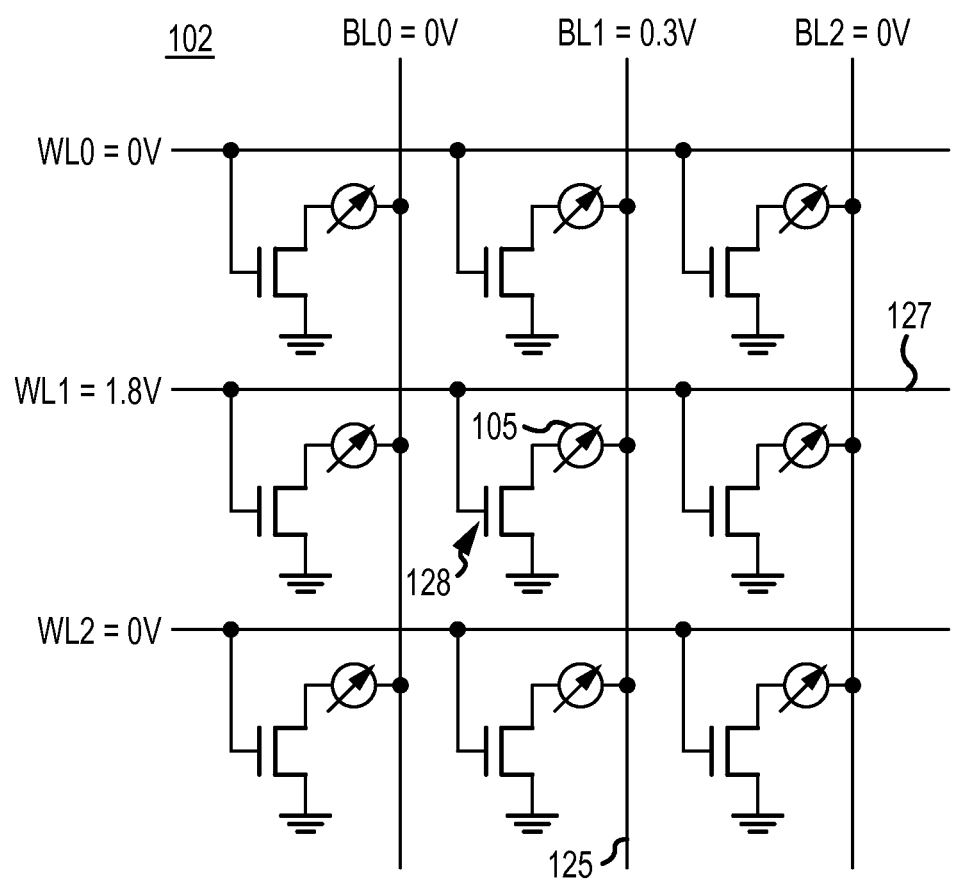
FIG. 1 is a schematic illustration of a portion of a resistance variable memory device.

FIG. 1 is a schematic illustration of a portion of a resistance variable memory device. A memory array 102 may include a plurality of memory cells. The memory cells each include a resistance variable memory element, e.g. an RRAM element 105. The resistance variable memory elements may also be implemented using, e.g. a phase change element or another resistive switching element. Each resistance variable memory element may be coupled to a data line, e.g. bit line 125 and a an access line, e.g. word line 127 by an access device, e.g. transistor 128. The transistor 128 is implemented as a metal oxide semiconductor field effect transistor (MOSFET) in FIG. 1, although other transistors may be used, e.g. a bipolar junction transistor. In other embodiments, a different switching element may be used instead of a transistor, e.g. a diode.

During operation, to access the memory element 105, a corresponding word line "WL1" in FIG. 1 may be biased at a first voltage, e.g. 1.8V, while surrounding word lines may be biased at a second voltage, e.g. 0V. A bit line "BL1" in FIG. 1 corresponding to the memory element 105 may be biased at a first voltage, e.g. 0.3V while surrounding bit lines may be biased at a second voltage, e.g. 0V. In this manner, the transistor 128 may turn on and a resistance of the memory element 105 may be sensed, e.g. by measuring a current through the element 105. A state of the memory element 105 may be changed by, e.g. applying a voltage to the data line sufficient to change the resistance state of the memory element 105.

As mentioned above, a state (e.g. resistance) of a resistance variable memory element may be set by providing a positive or negative voltage pulse to the memory element. Generally, the resistance change is a function of a change in a material property of the material used in the resistance variable memory element. Proper operation of the memory element may be tested to, e.g. ensure the element functions to change resistance with a provided voltage pulse and/or to ascertain the voltage level required to change the resistance of the memory element. Such testing may be include providing a series of positive voltage pulses to a memory element to set the memory element, followed by a series of negative voltage pulses to reset the memory element. Following each voltage pulse used to set or reset the memory element, a smaller pulse may be provided to read the state of the memory element (e.g. verify the memory element).

Figure 2:
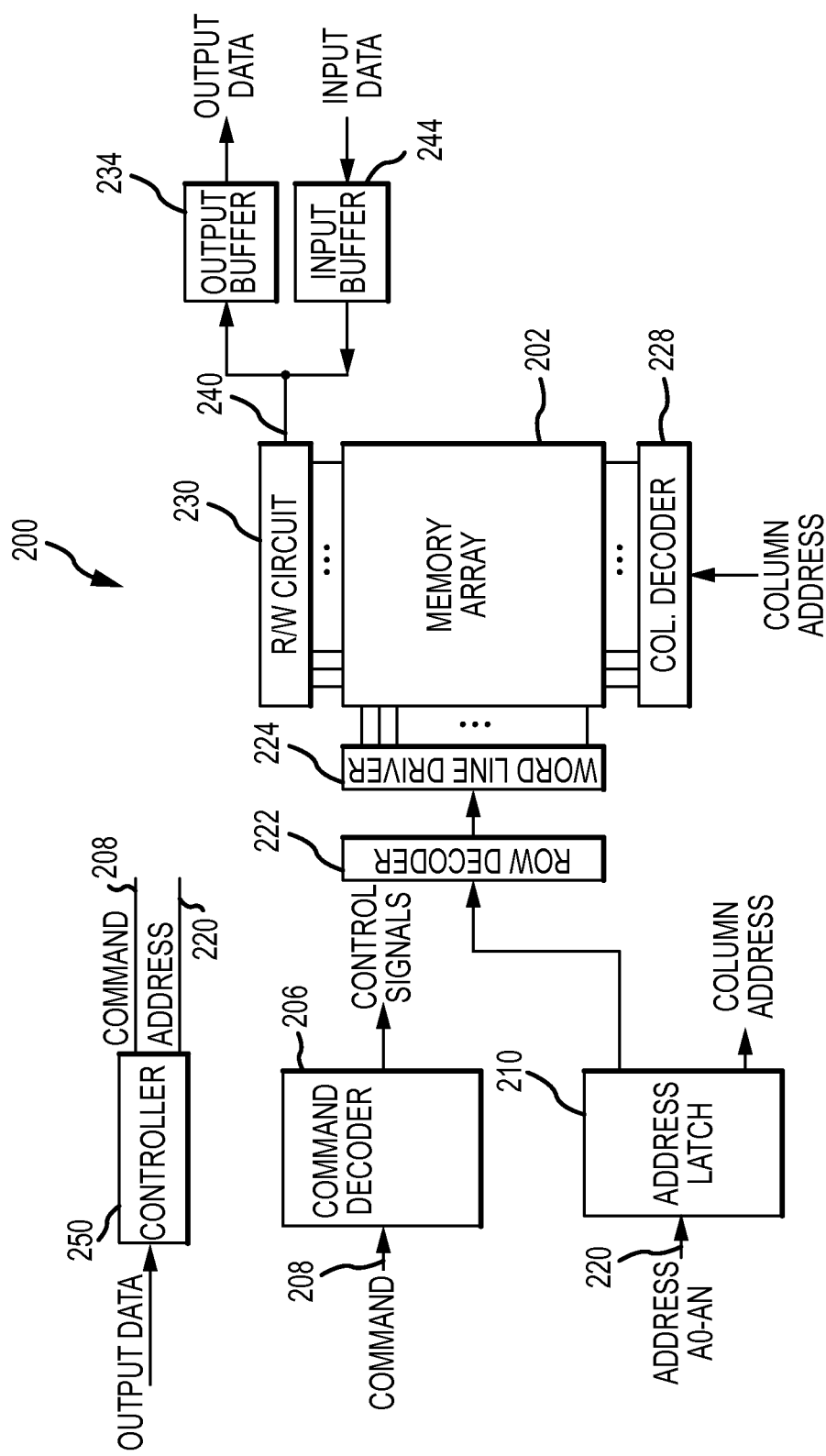
FIG. 2 is a schematic illustration of a portion of a memory according to an embodiment of the present invention.

FIG. 2 is a schematic illustration of a portion of an apparatus (e.g. a memory device, such as a memory module, or a memory system, such as a solid-state drive) 200 according to an embodiment of the present invention. The apparatus 200 includes an array 202 of memory cells, which may be, for example, resistance variable memory cells, including phase change memory cells, resistance variable random access memory cells, or other types of memory cells. The array 202 may be implemented using, e.g. the array 102 of FIG. 1. Referring again to FIG. 2, the apparatus 200 also includes a command decoder 206 that may receive memory commands through a command bus 208 and generate corresponding control signals within the apparatus 200 to cause various memory operations to be carried out. Accordingly, the command decoder 206 itself can be considered a controller and/or part of a controller. A controller 250 may provide the command signals on the command bus 208.

The controller 250 may include logic and/or a processor sufficient to provide the signals described herein. The controller may be implemented as a hardware module, such as logic circuitry and/or one or more processors, a software module, a firmware module, or combinations thereof. The controller 250 may be provided on a same semiconductor die as the memory array 202 in some examples, or may be communicatively coupled to a die including the memory array 202 in other examples. The command decoder 206 may respond to memory commands provided to the command bus 208 to perform various operations on the memory array 202. For example, the command decoder 206 may be used to generate internal control signals to read data from and write data to the memory array 202. The command decoder 206 may further be used to generate internal control signals to set and reset memory cells in the memory array 202, as will be described further below. The controller 250 may provide command signals to the command decoder 206 to cause the set and reset sequences described further below.

Row and column address signals may be provided to the memory system 200 through an address bus 220 and provided to an address latch 210. The row and column address signals may also be provided by the controller 250. The address latch may then output a separate column address and a separate row address. In some embodiments, the command and address buses 208 and 220 may be combined.

The row and column addresses may be provided by the address latch 210 to a row address decoder 222 and a column address decoder 228, respectively. The column address decoder 228 may select bit lines extending through the array 202 corresponding to respective column addresses. The row address decoder 222 may be connected to word line driver 224 that may activate respective rows of memory cells in the array 202 corresponding to received row addresses. The selected data line (e.g., a bit line or bit lines) corresponding to a received column address may be coupled to read/write circuitry 230 to provide read data to a data output buffer 234 via an input-output data bus 240. Write data may be provided to the memory array 202 through a data input buffer 244 and the memory array read/write circuitry 230. In some embodiments, the data bus 240 may be combined with the command and/or address buses 208 and/or 220.

As mentioned above, due to the variability which may be present in variable resistance memory cells, the cells may be set and reset during a test of the memory element. However, resistance variable memory cells may have one or more unstable states. Instability may arise due to variations in the material properties of the resistance variable element, for example. If a state is unstable, the memory cell may appear to pass a test, because the resistance of the memory cell may appear to properly be set in one state, and reset to another state. However, an unstable memory cell may not remain in the set or reset state until programmed otherwise. Instead, an unstable memory cell may spontaneously switch from the set or reset state to the opposite state, which may cause an inaccurate read. Accordingly, it may be advantageous to be able to detect unstable memory cells during a test. Moreover, the unstable memory cells may become stable following the application of additional set or reset pulses. Accordingly, it may be advantageous to continue to test these unstable memory cells until the memory cell becomes stable in some examples. In some examples, a memory cell may be intentionally stressed to determine if the memory cell is stable or is an unstable memory cell.

Figure 3:
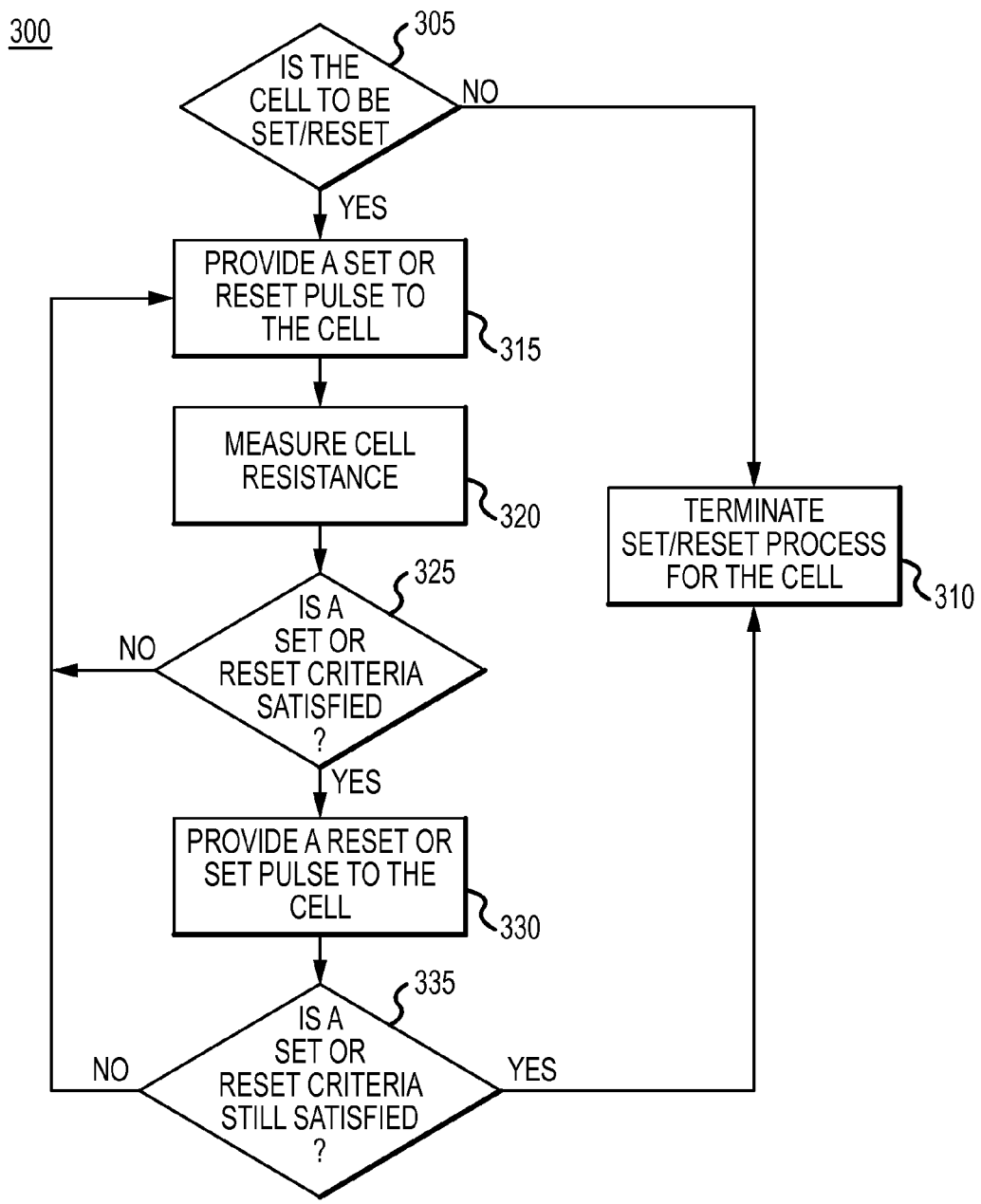
FIG. 3 is a flowchart illustrating a method in accordance with an embodiment of the present invention.

FIG. 3 is a flowchart illustrating a method in accordance with an embodiment of the present invention. The method 300 may be performed by the controller 250 of FIG. 2 in some examples, in cooperation with the command decoder 206. Referring again to FIG. 3, in block 305, a controller may evaluate whether a memory cell is to be set or reset. If a cell that should be in the set state (or reset state) is found, e.g. by measuring the cell resistance, to be in the set (or reset) state already, no operation may be performed on the cell, and the method 300 for that cell may be terminated in block 310. A next cell may then be evaluated. However, if the cell status is determined, e.g. by sensing the cell resistance, to be set (or reset) and the cell should be in the reset (or set) state, a reset (or set) operation should to be performed, and the method 300 may continue in block 315. The block 305 may not be implemented in some examples. For example, the block 305 may be used during a write operation to determine whether a memory cell is to be set or reset. However, during a testing operation, the block 305 may not be used and no evaluation of whether the memory cell is to be set or reset may be made.

In block 315, a set or reset pulse may be provided to the cell to place the memory cell in a target state (e.g. a set or reset state). Referring back to FIG. 2, the command decoder 206 may generate internal signals to cause a set or reset pulse to be provided to the cell. As described above, generally, set pulses may be positive voltages, while reset pulses may be negative voltages, however the opposite may be true in some embodiments, and in some embodiments currents may instead be used. In some examples, a square pulse may be used, in other examples, a triangle pulse or other pulse of changing magnitude may be used. Following the application of a set or reset pulse in block 315, the cell resistance may be determined (e.g. sensed) in block 320. The cell resistance may be sensed, e.g. using the read/write circuit 230 of FIG. 2, and a signal corresponding to the cell resistance may be provided as output data and communicated to the controller 250. In block 325, the cell resistance may be evaluated against a set or reset criteria, for example, to determine if the resistance of the memory cell indicates the memory cell is in the target state. If a set pulse was provided in block 315 (e.g. the set state is the target state), the set criteria is checked in block 325. If a reset pulse was provided in block 315 (e.g. the reset state is the target state), the reset criteria is checked in block 325.

If the resistance of the cell indicates that the memory cell is not in the target state in block 325, the method may continue again with block 315 where another pulse of the same type may be provided to the cell. The next time the pulse is provided, in some examples, a larger magnitude may be used. That is, if a pulse of a first magnitude was insufficient to set or reset the cell, a pulse of a second, greater, magnitude may be used the next time block 315 is performed. This process may continue until the criteria is satisfied in block 325, or until a threshold number of pulses have been provided to the cell without causing the cell to meet the set or reset criteria. If the cell does not meet the set or reset criteria after a threshold number of applicable pulses, the cell may be considered a defective cell.

Once the set or reset criteria has been satisfied in block 325, the cell may be considered to be functional in that it is able to be either set or reset. If a set pulse had been provided in block 315, once the set criteria is satisfied in 325, the cell may be considered to be in a low resistance state. If a reset pulse had been provided in block 315, once the reset criteria is satisfied in 325, the cell may be considered to be in a high resistance state.

However, recall as mentioned above, that the memory cell may be unstable. Even though the set or reset criteria had been satisfied in block 325, the memory cell may not remain reliably in the set or reset state. Accordingly, in block 330 the cell is intentionally stressed. For example, another pulse may be provided to the memory cell. The pulse provided to the cell in block 330 may generally be a lower magnitude than the pulse provided in the block 315. Moreover, the pulse provided to the cell in block 330 may be of an opposite polarity as the pulse provided to the cell in block 315. That is, if a set pulse (e.g. a positive voltage pulse) had been provided in the block 315, a reset pulse (e.g. a negative voltage pulse) may be provided in the block 330. If a reset pulse (e.g. a negative voltage pulse) had been provided in the block 315, a set pulse (e.g. a positive voltage pulse) may be provided in the block 330. The pulse may be provided by the command decoder 206 of FIG. 2 in cooperation with the controller 250.

The cell resistance may be again determined, and in block 335, a controller may evaluate whether the set or reset criteria remains satisfied to determine if the resistance of the memory cell indicates the memory cell is still in the target state. If the set or reset criteria is no longer satisfied, the method may return to block 315, and another set or reset pulse may be provided to the cell. In some examples, the set or reset pulse provided following block 335 may be of a same magnitude as the pulse previously applied during block 315. In other examples, a larger or smaller magnitude pulse may be used. If, in block 335, the set or reset criteria remains satisfied, the method may terminate the set or reset process for the cell in block 310, and the cell may be considered stable. That is, the controller 250 of FIG. 2 may utilize the memory cell as a stable cell, such as by providing (e.g. storing) an indication that the memory cell is stable. If the cell fails the test in block 335 more than a threshold number of times, the cell may be indicated (e.g. designated) as being unstable (e.g. unusable) and may be replaced in some examples. In some examples, the method 300 may be performed twice for each memory cell to be tested, once to test the set state of the memory cell and another time to test the reset state of the memory cell.

FIGS. 4A and 4B are schematic illustrations of applied voltages and measured currents of a memory cell in accordance with an embodiment of the present invention. Voltage is shown in FIG. 4A while average current during a reading pulse is shown in FIG. 4B. The finer details of the actual time behavior of cell current during the measurement is not shown in FIG. 4B since such details are not necessary to understanding, and may obscure, the examples described below. Accordingly, an average value is shown, which may be the parameter affecting the sensing. The measurements schematically shown in FIGS. 4A and 4B illustrate a memory cell that has satisfied both set and reset criteria and determined to be stable in both states in accordance with an example method of the present invention such as method 300 of FIG. 3. In FIG. 4A, a method may begin by providing a first set pulse 405. The set pulse 405 may be a positive voltage pulse. Referring to FIG. 4B, current levels indicative of a low resistance state 451 and a high resistance state 452 are shown. If a current through a cell is higher than or equal to the current 451, the cell may be considered to be in the low resistance state. If a current through the cell is less than or equal to the current 452, the cell may be considered to be in the high resistance state. Responsive to the first set voltage pulse 405, the current provided by the cell may increase, as indicated at time 455. While a step current response is shown for ease of illustration in FIG. 4B, the actual measured current response may not be a step, but may be a more gradual current increase.

Referring again to FIG. 4A, following the first voltage pulse 405, a verify pulse 407 is provided. The verify pulse 407 is provided to the cell to provide a reading of the current provided by the cell. Looking at FIG. 4B, responsive to the verify pulse 407, the current provided by the cell determines that the resistance of the cell is between the high and low resistance states. Accordingly, the set criteria (e.g. greater than or equal to the current indicative of the low resistance state), is not met. Therefore, the determined resistance of the memory cell indicates the memory cell is not in the target state (i.e. in this case, the set state) Referring to FIG. 4A, a second set pulse 410 is provided. The second set pulse 410 has a greater magnitude than the first set pulse 405. Responsive to the second set pulse 410, the current provided by the cell in FIG. 4B increases, but is still not sufficient to meet the set criteria. The fact that the current increases in this case is just an example, and in other examples the current may maintain the same value or decrease. Accordingly, when a second verify pulse 412 is provided in FIG. 4A, the current provided by the cell is still found not to meet the set criteria. A third set pulse 415 may then be provided.

Referring to FIG. 4B, responsive to the third set pulse 415, the current provided by the cell increases at time 465 and increases to an amount sufficient to meet the set criteria (e.g. greater than or equal to the amount indicated by the threshold 451). Accordingly, when a third verify pulse 417 is provided in FIG. 4A, the current provided by the cell is found to meet the set criteria. Therefore, the determined resistance of the memory cell indicates the memory cell is in the target state. Although three set pulses were used to attain the set criteria in FIGS. 4A and 4B, in other examples, other numbers of set pulses may be used to meet the set criteria— e,g. one pulse, two pulses, four pulses, or another number of pulses. Generally, successive set pulses may increase in magnitude in accordance with embodiments of the present invention.

Recall as mentioned above with regard to FIG. 3, while it may be determined that the cell has met the set criteria after the verify pulse 417 is provided, it may not be known whether the cell is stable in this state. Accordingly, the cell is intentionally stressed. For example, another pulse may be provided. Referring again to FIG. 4A, a reset pulse 420 is provided. The reset pulse 420 has a small magnitude, which may be a minimum pulse magnitude. Referring to FIG. 4B, responsive to the reset pulse 420, the current provided by the cell may not change. Although shown as not changing in FIG. 4B, the current may change somewhat responsive to the reset pulse 420, but may not change sufficiently to fail the set criteria (e.g. the current provided by the cell may still be greater than or equal to the current indicative of a low resistance state 451). Accordingly, when another verify pulse 422 is provided in FIG. 4A, the cell may still be found to meet the set criteria around time 467 in FIG. 4B. This cell may accordingly be determined to be stable in the set state.

The cell may now be tested for stability in the reset state. A first reset pulse 425 may be provided in FIG. 4A. The reset pulse may be of a negative voltage. Responsive to the reset pulse, the current provided by the cell may decrease at time 470. Again, although shown as step changes in FIG. 4B, an actual response of the cell may be different. Although the cell current has changed, it has not changed sufficiently to meet a reset criteria (e.g. lower than or equal to a threshold current indicative of a high resistance state 452). Accordingly, when a verify pulse 427 is provided in FIG. 4A, the cell is found not to meet the reset criteria.

A second reset pulse 430 may be provided. The second reset pulse 430 may have a greater magnitude than the first reset pulse. Responsive to the second reset pulse 430, the current provided by the cell may again decrease at time 475. Although the current has decreased, it has not decreased sufficiently to meet a reset criteria (e.g. lower than or equal to a threshold current indicative of a high resistance state 452). Accordingly, when a verify pulse 432 is provided in FIG. 4A, the cell is found not to meet the reset criteria.

A third reset pulse 435 may be provided in FIG. 4A. The third reset pulse 435 may have a greater magnitude than the second reset pulse. Responsive to the third reset pulse 435, the current provided by the cell may again decrease at time 480. The current decrease is sufficient to meet a reset criteria (e.g. it is lower than the threshold current 452). Accordingly, when a verify pulse 437 is provided in FIG. 4A, the cell is found to meet the reset criteria. Therefore, the determined resistance (via the measured current) of the memory cell indicates the memory cell is in the reset state.

While the cell meets the reset criteria, it may be unknown if the reset state is stable. Accordingly, a set pulse 440 may be provided in FIG. 4A. The set pulse may have a smaller magnitude than any of the set pulses 405, 410, and 415 used to try to set the cell, and may have a minimum magnitude. Nonetheless, the set pulse may have a minimum magnitude like the one utilized for verify pulses. Responsive to the set pulse 440, a current provided by the cell does not change in FIG. 4B, around time 482. Although shown as not changing at all, the current may change somewhat, but not enough to fail the reset criteria. Accordingly, when another verify pulse 442 is provided in FIG. 4A, the cell is still found to meet the reset criteria.

The cell tested in FIGS. 4A and 4B accordingly may be found to meet both the set and reset criteria and be stable in both states. The cell may be indicated as a stable (e.g. "good") cell, and may be used during normal operation of a memory device.

FIGS. 5A and 5B are schematic illustrations of applied voltages and measured currents of a memory cell in accordance with an embodiment of the present invention. Voltage is shown in FIG. 5A while current is shown in FIG. 5B. The measurements schematically shown in FIGS. 5A and 5B illustrate a memory cell that has satisfied a set criteria, but was found not to be stable in that state. Application of another set pulse 525 might be found to place the cell in a stable set state, however, in accordance with an example method of the present invention, such as method 300 of FIG. 3. Completion of a reset test is not shown in FIGS. 5A and 5B for brevity. In FIG. 5A, a method may begin by providing a first set pulse 505. The set pulse 505 may be a positive voltage pulse. Referring to FIG. 5B, current levels indicative of a low resistance state 551 and a high resistance state 552 are shown. If a current through a cell is higher than or equal to the current 551, the cell may be considered to be in the low resistance state. If a current through the cell is less than or equal to the current 552, the cell may be considered to be in the high resistance state. Responsive to the first set voltage pulse 505, the current provided by the cell may increase, as indicated at time 555. While a step current response is shown for ease of illustration in FIG. 5B, the actual measured current response may not be a step, but may be a more gradual current increase.

Referring again to FIG. 5A, following the first voltage pulse 505, a verify pulse 507 is provided. The verify pulse 507 is provided to the cell to provide a reading of the current provided by the cell. Looking at FIG. 5B, responsive to the verify pulse 507, the current provided by the cell is used to determine that the resistance of the memory cell is between the high and low resistance states. Accordingly, the set criteria (e.g. greater than or equal to the current indicative of the low resistance state), is not met. Therefore, the determined resistance of the memory cell indicates the memory cell is not in the set state. Referring to FIG. 5A, a second set pulse 510 is provided. The second set pulse 510 has a greater magnitude than the first set pulse 505. Responsive to the second set pulse 510, the current provided by the cell in FIG. 5B increases at time 560, but is still not sufficient to meet the set criteria. Accordingly, when a second verify pulse 512 is provided in FIG. 5A, the current provided by the cell is still found not to meet the set criteria. A third set pulse 515 may then be provided.

Referring to FIG. 5B, responsive to the third set pulse 515, the current provided by the cell increases at time 565 and increases to an amount sufficient to meet the set criteria (e.g. greater than or equal to the amount indicated by the threshold 551). Accordingly, when a third verify pulse 517 is provided in FIG. 5A, the current provided by the cell is found to meet the set criteria. Therefore, the determined resistance indicates the memory cell is in the set state. Although three set pulses were used to attain the set criteria in FIGS. 5A and 5B, in other examples, other numbers of set pulses may be used to meet the set criteria—e.g. one pulse, two pulses, four pulses, or another number of pulses. Generally, successive set pulses may increase in magnitude in accordance with embodiments of the present invention.

Recall as mentioned above with regard to FIG. 3, while it may be determined that the cell has met the set criteria after the verify pulse 517 is provided, it may not be known whether the cell is stable in this state. Accordingly, another pulse may be provided. Referring again to FIG. 5A, a reset pulse 520 is provided. The reset pulse 520 has a small magnitude, which may be a minimum pulse magnitude (e.g. a unit magnitude which generally may be smaller in magnitude than previously-applied reset pulses). Referring to FIG. 5B, responsive to the reset pulse 520, the current provided by the cell may change and may fall below the current indicative of a low resistance state (e.g. current 551). Accordingly the cell may fail the set criteria when another verify pulse 522 is provided in FIG. 5A. This cell may accordingly be determined to be unstable in the set state.

Although the cell has been determined to be unstable, it may become stable if provided with further set pulses. Accordingly, another set pulse 525 is provided in FIG. 5A. The set pulse 525 may have a same magnitude as the previously applied set pulse 515. In other embodiments, the set pulse 525 may have a larger or smaller magnitude. Responsive to the set pulse 525, the current provided by the cell increases at a time 570 in FIG. 5B. The current increases sufficiently to meet a set criteria (e.g. greater than the current threshold 551). Accordingly, when a verify pulse 527 is provided in FIG. 5A, the cell may be found to meet the set criteria. This cell has previously been found to meet the set criteria, but to be unstable. The stability of the cell can again be checked A reset pulse 530 is provided in FIG. 5A. The reset pulse 530 may be of a smaller magnitude than the set pulses applied, and may be a minimum pulse. This time, responsive to the reset pulse 530, the current provided by the cell does not change, as seen around time 573. Although shown as not changing at all, the current provided by the cell may change somewhat, but not enough to fail the set criteria. Accordingly, when another verify pulse 532 is provided in FIG. 5A, the cell is found to meet the set criteria. The cell is now determined to be stable in the set state.

If the cell had not become stable responsive to the additional set pulse 525, the process may be repeated with application of another set pulse. In some examples, the process may be repeated until a threshold number of failed stability tests, at which time the cell may be indicated as unstable (e.g. unusable) and may be replaced by a cell meeting stability tests.

An analogous process may be provided occur for a cell that may not be initially stable in a reset state, but a detailed example is not shown here in the interest of brevity.

From the foregoing it will be appreciated that, although specific embodiments of the invention have been described herein for purposes of illustration, various modifications may be made without deviating from the spirit and scope of the invention. For example, while examples described herein have included the application of voltage pulses to a memory cell to set and reset the cell, in other embodiments current or other pulses may be used. Moreover, while examples described herein have included use of a pulse having an opposite polarity following the set or reset to confirm stability of the state, pulses of a same polarity may also be used.

What is claimed:

1. A method comprising:
providing a plurality of state pulses to a resistance variable memory cell to determine whether the resistance variable memory cell satisfies a programming criterion by entering a first state;
responsive to a resistance of a resistance variable memory cell indicating the resistance variable memory cell satisfies the programming criterion, providing a pulse to the resistance variable memory cell, wherein a polarity of the plurality of state pulses is opposite of a polarity of the pulse;
determining a resistance of the resistance variable memory cell after providing the pulse to the resistance variable memory cell to determine whether the resistance variable memory cell satisfies a stability criterion by remaining in the first state; and
responsive to the resistance of the resistance variable memory cell indicating the resistance variable memory cell satisfies the stability criterion by remaining in the first state, designating the resistance variable memory cell as stable.

2. The method of claim 1, further comprising sensing the resistance of the resistance variable memory cell.

3. The method of claim 1, further comprising, after providing a first state pulse of the plurality of state pulses, providing another state pulse of the plurality of state pulses having a magnitude greater than the first state pulse responsive to the resistance of the resistance variable memory cell indicating the resistance variable memory cell did not satisfy the programming criterion following the first state pulse.

4. The method of claim 3, wherein the first state is one of a set state or a reset state.

5. The method of claim 1, wherein a magnitude of the first state pulse is greater than a magnitude of the pulse.

6. A method comprising:
providing a plurality of state pulses having a first polarity to a resistance variable memory cell to determine whether the resistance variable memory cell satisfies a programming criterion;
stressing the resistance variable memory cell in a target state by providing a at least one pulse to the resistance variable memory cell of an opposite polarity of the plurality of state pulses to determine whether the resistance variable memory cell satisfies a stability criterion responsive to a resistance of the resistance variable memory cell indicating the resistance variable memory cell satisfies the programming criterion;

determining whether the resistance variable memory cell remains in the target state; and responsive to the resistance variable cell remaining in the target state in satisfaction of the stability criterion, designating the resistance variable cell as stable.

7. The method of claim 6, wherein stressing the resistance variable cell comprises providing at least one pulse to the resistance variable cell.

8. The method of claim 7, further comprising, responsive to the resistance variable cell changing to a state other than the target state after stressing the resistance variable cell:

providing a target state pulse to the resistance variable memory cell to place the resistance variable memory cell into the target state; and stressing the resistance variable memory cell a second time.

9. The method of claim 8, further comprising designating the resistance variable cell as unstable responsive to the resistance variable cell changing to a state other than the target state after stressing the resistance variable cell a threshold number of times.

10. The method of claim 9, wherein the target state is one of a low resistance state or a high resistance state, and wherein the state other than the target state is the other of the low resistance state and the high resistance state.

11. The method of claim 6, further comprising indirectly sensing the resistance of the resistance variable memory cell.

12. A method comprising:

providing a series of pulses to a resistance variable memory cell to place the resistance variable memory cell in a first state, wherein each successive pulse in the series of pulses increases in magnitude; and determining, after provision of each individual pulse in the series of pulses, whether the resistance variable memory cell is in a second state;

responsive to determining that the variable memory cell is in the first state, providing a stress pulse to the resistance variable memory cell, wherein providing the stress pulse to the resistance variable memory cells comprises providing at least one pulse to the resistance variable memory cell of an opposite polarity of the series of pulses; and responsive to a resistance of the resistance variable memory cell indicating the resistance variable memory cell is in the second state after providing the stress pulse, designating the resistance variable memory cell as defective.

13. The method of claim 12, further comprising, responsive to the resistance variable memory cell remaining in the first state after stressing the resistance variable memory cell, designating the resistance variable memory cell as stable in the first state.

14. The method of claim 13, further comprising determining whether the resistance variable memory cell is stable in the second state after designating the resistance variable memory cell as stable in the first state.

15. The method of claim 14, wherein determining whether the resistance variable memory cell is stable in the second state comprises:

providing a second pulse to the resistance variable memory cell to place the resistance variable memory cell in the second state; and responsive to the resistance variable memory cell being in the second state after provision of the second pulse, providing a second stress pulse to the resistance variable memory cell.

16. The method of claim 14, storing an indication that the resistance variable memory cell is stable responsive to determining that the resistance variable memory cell is stable in the first state and is stable in the second state.

* * * * *